United States Patent
Chen et al.

(10) Patent No.: US 8,564,143 B2
(45) Date of Patent: Oct. 22, 2013

(54) OVERLAY MARK FOR MULTIPLE PRE-LAYERS AND CURRENTLY LAYER

(75) Inventors: Yi-Ting Chen, Kaohsiung (TW);
Chien-Hao Chen, Tainan (TW);
Yuan-Chi Pai, Tainan (TW); Chun-Chi Yu, Taipei (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 13/366,622

(22) Filed: Feb. 6, 2012

(65) Prior Publication Data
US 2013/0200535 A1 Aug. 8, 2013

(51) Int. Cl.
*H01L 23/544* (2006.01)
*H01L 21/66* (2006.01)
*G01B 11/00* (2006.01)

(52) U.S. Cl.
USPC .............. 257/797; 257/E23.179; 257/E21.53; 356/401; 438/401

(58) Field of Classification Search
USPC .............................. 257/797, E23.179, E21.53
See application file for complete search history.

(56) References Cited

U.S. PATENT DOCUMENTS

| | | | |
|---|---|---|---|
| 7,408,642 B1 * | 8/2008 | DiBiase | 356/401 |
| 7,440,105 B2 | 10/2008 | Adel et al. | |
| 8,084,872 B2 * | 12/2011 | Yang | 257/797 |
| 8,183,123 B2 * | 5/2012 | Yang | 438/401 |
| 8,193,648 B2 * | 6/2012 | Lan et al. | 257/797 |
| 8,329,360 B2 * | 12/2012 | Huang et al. | 430/5 |
| 8,330,281 B2 * | 12/2012 | Ghinovker et al. | 257/797 |
| 2005/0285283 A1 * | 12/2005 | Huggins | 257/797 |
| 2007/0069398 A1 * | 3/2007 | Smith et al. | 257/797 |
| 2007/0155946 A1 * | 7/2007 | Berti et al. | 528/272 |
| 2008/0230929 A1 * | 9/2008 | Shin et al. | 257/797 |
| 2011/0012271 A1 * | 1/2011 | Chiu | 257/797 |
| 2011/0133347 A1 * | 6/2011 | Huang et al. | 257/797 |
| 2011/0156285 A1 * | 6/2011 | Lan et al. | 257/797 |

* cited by examiner

*Primary Examiner* — A O Williams
(74) *Attorney, Agent, or Firm* — J.C. Patents

(57) ABSTRACT

An overlay mark is described, including N (N≥2) groups of first x-directional linear patterns each defined from a different one of N pre-layers, N groups of second x-directional linear patterns of a current layer, N groups of first y-directional linear patterns each defined from a different one of the N pre-layers, and N groups of second y-directional linear patterns of the current layer. Each group of second x-directional linear patterns is disposed together with one group of first x-directional linear patterns, wherein the second linear patterns and the x-directional linear patterns are arranged alternately. Each group of second y-directional linear patterns is disposed together with one group of first y-directional linear patterns, wherein the second linear patterns and the first linear patterns are arranged alternately.

11 Claims, 1 Drawing Sheet

OVERLAY MARK FOR MULTIPLE PRE-LAYERS AND CURRENTLY LAYER

BACKGROUND OF THE INVENTION

1. Field of Invention

This invention relates to an integrated circuit (IC) process, and more particularly relates to an overlay mark used for alignment accuracy measurement in an IC process.

2. Description of Related Art

As the linewidth of the IC process continuously gets narrower, the alignment accuracy between a lower layer and an upper layer becomes more and more important. Therefore, an overlay mark is generally formed on a wafer to check alignment accuracy.

A conventional overlay mark typically includes x-directional linear patterns and y-directional linear patterns of a single pre-layer, and x-directional linear patterns and y-directional linear patterns of the current layer. Overlay errors have been measured only between two adjacent layers.

However, in ICs with multiple layers, displacement between non-adjacent layers may compromise IC performance. Therefore, improving the integrity of overlay marks between multiple pre-layers is still an important issue in the field.

SUMMARY OF THE INVENTION

Accordingly, this invention provides an overlay mark used in an IC process for alignment accuracy measurement.

The overlay mark of this invention includes N (N≥2) groups of first x-directional linear patterns each defined from a different one of N pre-layers, N groups of second x-directional linear patterns of a current layer, N groups of first y-directional linear patterns each defined from a different one of the N pre-layers, and N groups of second y-directional linear patterns of the current layer. Each group of second x-directional linear patterns is disposed together with one group of first x-directional linear patterns, wherein the second x-directional linear patterns and the first x-directional linear patterns are arranged alternately. Each group of second y-directional linear patterns is disposed together with one group of first y-directional linear patterns, wherein the second y-directional linear patterns and the first y-directional linear patterns are arranged alternately.

In an embodiment, at least one pre-layer among the N pre-layers is defined by M (M≥2) exposure steps, the group of first x-directional linear patterns of the at least one pre-layer includes M sets of first x-directional linear patterns defined by the M exposure steps respectively and disposed in M first regions respectively, and the group of first y-directional linear patterns of the at least one pre-layer includes M sets of first y-directional linear patterns defined by the M exposure steps respectively and disposed in M second regions respectively.

In another embodiment, at least one pre-layer among the N pre-layers requires higher overlay accuracy than the other(s), the group of first x-directional linear patterns of the at least one pre-layer includes M sets of first x-directional linear patterns disposed in M first regions respectively, and the group of first y-directional linear patterns of the at least one pre-layer includes M sets of first y-directional linear patterns disposed in M second regions respectively.

Since the linear patterns of at least two (N≥2) pre-layers are disposed together with the linear patterns of the current layer in the overlay mark of this invention, the overlay measurement is more convenient so that the overlay measurement time is saved, and the area utilization efficiency of the overlay mark is higher than the prior art.

In order to make the aforementioned and other objects, features and advantages of the present invention comprehensible, a preferred embodiment accompanied with figures is described in detail below.

DESCRIPTION OF EMBODIMENTS

It is noted that the following embodiments of N=2 are intended to further explain this invention but not to limit its scope. For example, it is possible to include linear patterns of more than two (N>2) pre-layers in one overlay mark of this invention.

Figure 1:
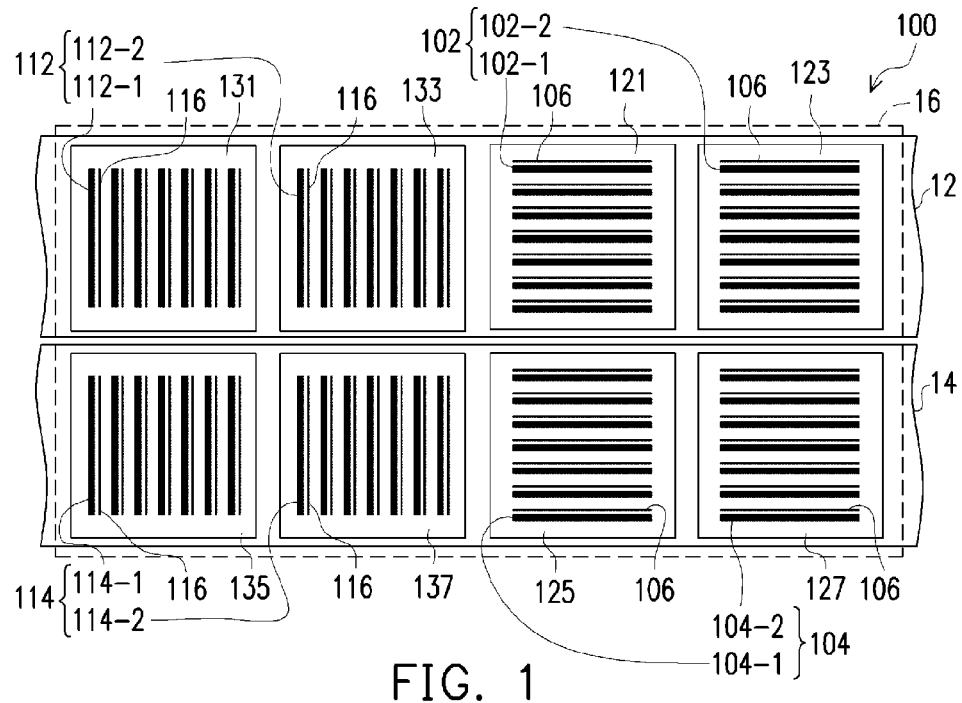
FIG. 1 illustrates the top view of an overlay mark according to a first embodiment of this invention.

FIG. 1 illustrates the top view of an overlay mark according to the first embodiment of this invention, which includes patterns of two pre-layers each defined by two exposure steps, and patterns of the current layer.

Referring to FIG. 1, the overlay mark 100 includes a group of x-directional linear patterns 102 of the first pre-layer 12, a group of x-directional linear patterns 104 of the second pre-layer 14, two groups of x-directional linear patterns 106 of the current layer 16, a group of y-directional linear patterns 112 of the first pre-layer 12, a group of y-directional linear patterns 114 of the second pre-layer 14, and two groups of y-directional linear patterns 116 of the current layer 16. The x-directional linear patterns 102 of the first pre-layer and one group of x-directional linear patterns 106 of the current layer 16 are arranged alternately. The x-directional linear patterns 104 of the second pre-layer 14 and the other group of x-directional linear patterns 106 of the current layer 16 are arranged alternately. The y-directional linear patterns 112 of the first pre-layer 12 and one group of y-directional linear patterns 116 of the current layer 16 are arranged alternately. The y-directional linear patterns 114 of the second pre-layer 14 and the other group of y-directional linear patterns 116 of the current layer 16 are arranged alternately.

In this embodiment, each of the two (N=2) pre-layer (including the first pre-layer 12 and the second pre-layer 14) is defined by two (M=2) exposure steps. The group of x-directional linear patterns 102 of the first pre-layer 12 includes two sets 102-1 and 102-2 defined by the two exposure steps respectively and disposed in two neighboring regions 121 and 123 respectively. The group of x-directional linear patterns 104 of the second pre-layer 14 includes two sets 104-1 and 104-2 defined by the two exposure steps respectively and disposed in two neighboring regions 125 and 127 respectively. The group of y-directional linear patterns 112 of the first pre-layer includes two sets 112-1 and 112-2 defined by the two exposure steps respectively and disposed in two neighboring regions 131 and 133 respectively. The group of y-directional linear patterns 114 of the second pre-layer 14 includes two sets 114-1 and 114-2 defined by the two exposure steps respectively and disposed in two neighboring regions 135 and 137 respectively.

In this embodiment, the region (121+123) of the group of x-directional linear patterns 102 of the first pre-layer 12 and the region (131+133) of the group of first y-directional linear patterns 112 of the first pre-layer 12 are arranged in the x-direction. The region (125+127) of the group of x-directional linear patterns 104 of the second pre-layer 14 and the region (135+137) of the group of first y-directional linear patterns 114 of the second pre-layer 14 are arranged also in the x-direction. The two regions (121+123 and 125+127) of the two groups of x-directional linear patterns 102 and 104 of the two pre-layers are arranged in the y-direction. The two regions (131+133 and 135+137) of the two groups of y-directional linear patterns 112 and 114 are arranged also in the y-direction. Nevertheless, all the above arrangement directions can be turned by 90° at the same time, depending on the shape of the area for forming the overlay mark.

The overlay mark can be used to derive overlay errors in the following manner. The x-overlay error of the first exposure step of the first pre-layer 12 with respect to the current layer 16 is taken as an example here. First, for each pair of a y-directional linear pattern 112-1 defined by the first exposure step to the first pre-layer 12 and a y-directional linear pattern 116 of the current layer 16, the distance between the two is measured. An average distance is then calculated from the measured distance values for all the pairs of 112-1 and 116, and is compared with a predetermined value to derive the result, wherein the predetermined value corresponds to a case where no x-overlay error is present.

Figure 2:
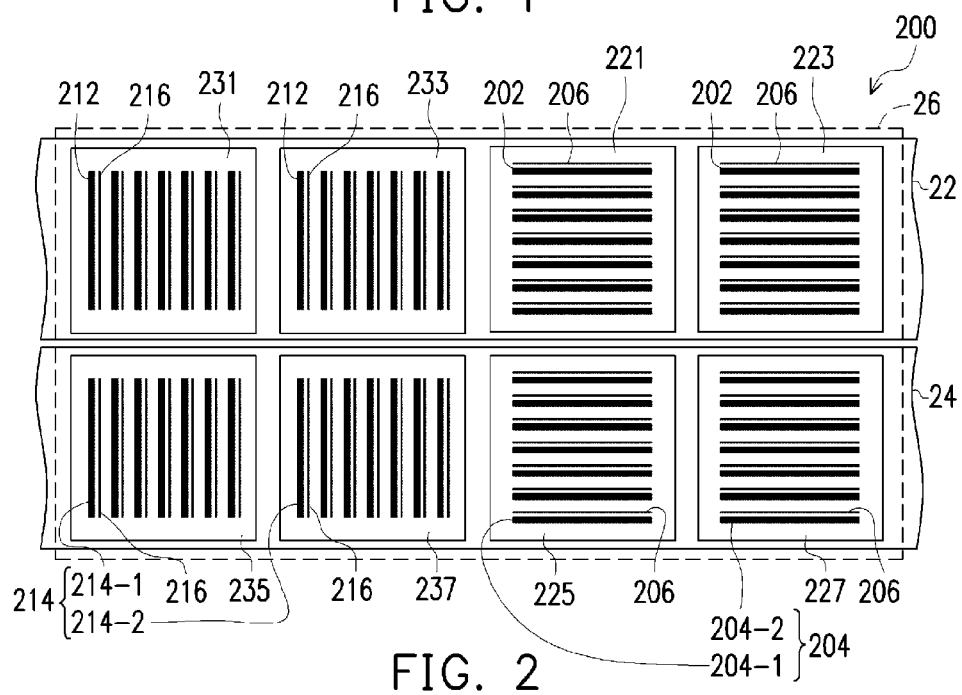
FIG. 2 illustrates the top view of an overlay mark according to a second embodiment of this invention.

FIG. 2 illustrates the top view of an overlay mark according to the second embodiment of this invention. The second embodiment is different from the first one in that the first pre-layer 22 requires higher overlay accuracy than the second pre-layer 24 and hence is weighted in the number of the patterns thereof defined by an exposure step.

Referring to FIG. 2, the overlay mark 200 includes a group of x-directional linear patterns 202 of the first pre-layer 22, a group of x-directional linear patterns 204 of the second pre-layer 24, two groups of x-directional linear patterns 206 of the current layer 26, a group of y-directional linear patterns 212 of the first pre-layer 22, a group of y-directional linear patterns 214 of the second pre-layer 24, and two groups of y-directional linear patterns 216 of the current layer 26. The x-directional linear patterns 202 of the $1^{st}$ pre-layer and one group of x-directional linear patterns 206 of the current layer 26 are arranged alternately. The x-directional linear patterns 204 of the second pre-layer 24 and the other group of x-directional linear patterns 206 of the current layer 26 are arranged alternately. The y-directional linear patterns 212 of the $1^{st}$ pre-layer and one group of y-directional linear patterns 216 of the current layer 26 are arranged alternately. The y-directional linear patterns 214 of the $2^{nd}$ pre-layer and the other group of y-directional linear patterns 216 of the current layer 26 are arranged alternately.

In this embodiment, the second pre-layer 24 is defined by two (M=2) exposure steps as in the precedent embodiment. Similarly, the group of x-directional linear patterns 204 for the second pre-layer 24 includes two sets 204-1 and 204-2 defined by the two exposure steps respectively and disposed in two neighboring regions 225 and 227 respectively. The group of y-directional linear patterns 214 for the second pre-layer 24 includes two sets 214-1 and 214-2 defined by the two exposure steps respectively and disposed in two neighboring regions 235 and 237 respectively.

On the other hand, the first pre-layer 22 is defined by only one exposure step, but requires higher overlay accuracy than the second pre-layer 24. Hence, a "weight" is given to the pattern of the first pre-layer 22. More specifically, the group of x-directional linear patterns 202 of the first pre-layer 22 includes two sets disposed in two neighboring regions 221 and 223 respectively, and the group of y-directional linear patterns 212 of the first pre-layer 22 includes two sets in two neighboring regions 231 and 233 respectively.

In this embodiment, the region (221+223) of the group of x-directional linear patterns 202 of the first pre-layer 22 and the region (231+233) of the group of first y-directional linear patterns 212 of the first pre-layer are arranged in the x-direction. The region (225+227) of the group of x-directional linear patterns 204 of the second pre-layer 24 and the region (235+237) of the group of first y-directional linear patterns 214 of the second pre-layer 24 are arranged also in the x-direction. The two regions (221+223 and 225+227) of the two groups of x-directional linear patterns 202 and 204 of the two pre-layers are arranged in the y-direction. The two regions (231+233 and 235+237) of the two groups of y-directional linear patterns 212 and 214 of the two pre-layers are arranged also in the y-direction. Nevertheless, all the above arrangement directions can be turned by 90° at the same time, depending on the shape of the area for forming the overlay mark.

As indicated by the above embodiments, since the linear patterns of at least two (N≥2) pre-layers are disposed together with the linear patterns of the current layer in the overlay mark of this invention, the overlay measurement is more convenient so that the overlay measurement time is saved, and the area utilization efficiency of the overlay mark is higher than the conventional overlay mark.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. An overlay mark, comprising:
   N (N≥2) groups of first x-directional linear patterns, wherein each group is defined from a different one of N pre-layers;
   N groups of second x-directional linear patterns of a current layer, wherein each group of second x-directional linear patterns is disposed together with one group of first x-directional linear patterns, wherein the second x-directional linear patterns and the first x-directional linear patterns are arranged alternately;
   N (N≥2) groups of first y-directional linear patterns, wherein each group is defined from a different one of the N pre-layers; and
   N groups of second y-directional linear patterns of the current layer, wherein each group of second y-directional linear patterns is disposed together with one group of first y-directional linear patterns, wherein the second y-directional linear patterns and the first y-directional linear patterns are arranged alternately.

2. The overlay mark of claim 1, wherein N=2.

3. The overlay mark of claim 1, wherein
   a region of the group of first x-directional linear patterns of any one pre-layer among the N pre-layers and a region of the group of first y-directional linear patterns of the one pre-layer are arranged in a first direction,
   N regions of the N groups of first x-directional linear patterns are arranged in a second direction,
   N regions of the N groups of first y-directional linear patterns are arranged in the second direction, and
   one of the first direction and the second direction is the x-direction and the other of the first direction and the second direction is the y-direction.

4. The overlay mark of claim 1, wherein
   at least one of the N pre-layers is defined by M (M≥2) exposure steps, the group of first x-directional linear patterns of the at least one pre-layer includes M sets of first x-directional linear patterns defined by the M exposure steps respectively and disposed in M first regions respectively, and the group of first y-directional linear patterns of the at least one pre-layer includes M sets of first y-directional linear patterns defined by the M exposure steps respectively and disposed in M second regions respectively.

5. The overlay mark of claim 4, wherein the M first regions and the M second regions are arranged in the x-direction or in the y-direction.

6. The overlay mark of claim 5, wherein N=2, each of the N pre-layers is defined by two (M=2) exposure steps, the two (M=2) first regions are arranged neighboring to each other, and the two (M=2) second regions are arranged neighboring to each other.

7. The overlay mark of claim 1, wherein at least one of the N pre-layers requires higher overlay accuracy than the other(s), the group of first x-directional linear patterns of the at least one pre-layer includes P (P≥2) sets of first x-directional linear patterns disposed in P first regions respectively, and the group of first y-directional linear patterns of the at least one pre-layer includes P sets of first y-directional linear patterns disposed in P second regions respectively.

8. The overlay mark of claim 7, wherein, wherein the M first regions and the M second regions are arranged in the x-direction or in the y-direction.

9. The overlay mark of claim 8, wherein N=2, one of the N pre-layers requires higher overlay accuracy than the other, M=2, the two (M=2) first regions are arranged neighboring to each other, and the two (M=2) second regions are arranged neighboring to each other.

10. The overlay mark of claim 1, wherein at least one first pre-layer among the N pre-layers is defined by M (M≥2) exposure steps, the group of first x-directional linear patterns of the at least one first pre-layer include M sets of first x-directional linear patterns defined by the M exposure steps respectively and disposed in M first regions respectively, the group of first y-directional linear patterns of the at least one first pre-layer include M sets of first y-directional linear patterns defined by the M exposure steps respectively and disposed in M second regions respectively, at least one second pre-layer among the N pre-layers requires higher overlay accuracy than the other(s), the group of first x-directional linear patterns of the at least one second pre-layer includes P (P≥2) sets of first x-directional linear patterns disposed in P third regions respectively, and the group of first y-directional linear patterns of the at least one second pre-layer includes P sets of first y-directional linear patterns disposed in P fourth regions respectively.

11. The overlay mark of claim 1, wherein at least one of the N pre-layers is given a weight, the group of first x-directional linear patterns of the at least one pre-layer includes P (P≥2) sets of first x-directional linear patterns disposed in P first regions respectively, and the group of first y-directional linear patterns of the at least one pre-layer includes P sets of first y-directional linear patterns disposed in P second regions respectively.

* * * * *